United States Patent [19]
Pankove

[11] Patent Number: 4,985,742
[45] Date of Patent: Jan. 15, 1991

[54] HIGH TEMPERATURE SEMICONDUCTOR DEVICES HAVING AT LEAST ONE GALLIUM NITRIDE LAYER

[75] Inventor: Jacques I. Pankove, Boulder, Colo.

[73] Assignee: University of Colorado Foundation, Inc., Boulder, Colo.

[21] Appl. No.: 376,786

[22] Filed: Jul. 7, 1989

[51] Int. Cl.$^5$ ............... H01L 29/161; H01L 29/72; H01L 27/14
[52] U.S. Cl. ........................ 357/34; 357/20; 357/16; 357/30
[58] Field of Search .............. 357/30 B, 30 E, 30 J, 357/16, 20, 34, 34 HB, 30 H, 30 P, 30 Q

[56] References Cited

U.S. PATENT DOCUMENTS

| | | | |
|---|---|---|---|
| 3,799,803 | 3/1974 | Kraus et al. | 357/30 B |
| 3,819,974 | 6/1974 | Stevenson | 313/499 |
| 3,869,322 | 3/1975 | Cuomo et al. | 357/16 |
| 3,922,475 | 11/1975 | Manasevit | 428/539 |
| 3,922,703 | 11/1975 | Pankove | 357/17 |
| 4,139,858 | 2/1979 | Pankove | 357/30 |
| 4,224,073 | 9/1980 | Sasaki et al. | 106/44 |

FOREIGN PATENT DOCUMENTS 0125871 10/1981 Japan .................... 357/16

OTHER PUBLICATIONS

Pankove, Jacques I., "Properties of Gallium Nitride", Materials Research Society Symposium Proceedings, vol. 97, (1987).
Pankove, J. I., S. Bloom, and G. Harbeke, "Optical Properties of Gallium Nitride", RCA Review, vol. 36, No. 1 (Mar. 1975).
Pankove, Jacques I., Optical Processes in Semiconductors, Dover Publications, Inc. (1971); Section 14-E-1, pp. 331 and 332.
Berkeyheiser, E., S. J. Kilpatrick and C. W. Magee, "Passivation of GaAs Surfaces, Journal of Electronic Materials", vol. 12, No. 2, pp. 359-370, (1983).
"Position Sensors", Advertising Brochure Published by Silicon Detector Corporation, 855 Lawrence Drive, Newbury Park, Calif. A 91320, including drawing dated Sept. 22, 1977.

Primary Examiner—Andrew J. James
Assistant Examiner—Ngan Van Ngo
Attorney, Agent, or Firm—Chester E. Martine, Jr.; Earl C. Hancock

[57] ABSTRACT

A device having high temperature operating characteristics is provided by depositing n-type cubic gallium nitride on n-type cubic silicon carbide to provide an ohmic contact or electrode. High temperature operating characteristics are also provided in a device having a pn heterojunction between a layer of cubic p-type silicon carbide or gallium arsenide and a first layer of cubic n-type gallium nitride. In a power transistor, a second layer of n-type gallium nitride is deposited on the other surface of the silicon carbide or gallium arsenide to form a pn heterojunction. The gallium nitride layer that is connected as an emitter is forward biased to cause electron injection into the silicon carbide or gallium arsenide layer. In a phototransistor device having high temperature operating characteristics, a transparent layer of cubic n-type gallium nitride is deposited on each side of either cubic p-type silicon carbide or gallium arsenide. Small electrodes are connected to the gallium nitride to minimize blockage of radiation. The radiation passes through either or both gallium nitride layers and across the pn junction to generate a potential between the electrodes. Direction-sensing and position-sensing devices having high temperature and high photon energy operating characteristics are also provided using layers of silicon carbide or gallium arsenide, and gallium nitride.

19 Claims, 3 Drawing Sheets

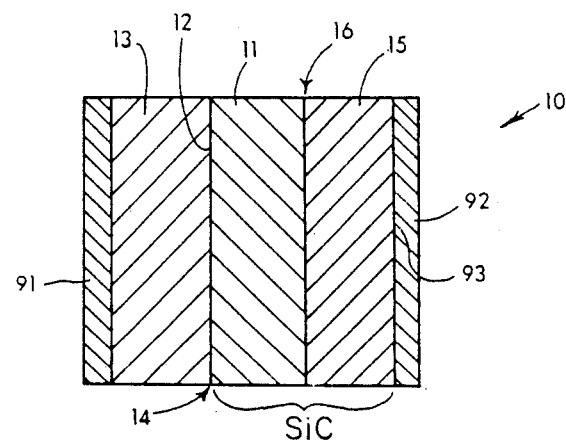

HIGH TEMPERATURE SEMICONDUCTOR DEVICES HAVING AT LEAST ONE GALLIUM NITRIDE LAYER

FIELD OF INVENTION

This invention relates to semiconductor devices having at least one gallium nitride layer, and more particularly to semiconductor devices capable of operation at high temperatures.

BACKGROUND OF THE INVENTION

In the past, semiconductor devices have been provided with electrodes made from materials such as aluminum or gold, but the use of such electrodes is limited due to the relatively low temperature at which these materials form an alloy with silicon. For example, the eutectic point for aluminum and silicon is 350° C. and for gold and silicon is 450° C. Others have used tin oxide for transparent contacts on semiconductor devices, but many applications require higher conductivity than that of tin oxide.

It has been recognized that gallium nitride may be deposited on n-type silicon without including any acceptor impurity in the reacting vapors. In this manner, n-type, conductive gallium nitride can be deposited. When impurities such as zinc, beryllium, lithium or magnesium are added as acceptor impurities, the gallium nitride is insulating. These forms of gallium nitride have been used in electroluminescent devices that include a conductive n-type layer of gallium nitride and an insulating layer of gallium nitride on a sapphire substrate, as in U.S. Pat. No. 3,922,703 invented by Applicant. The properties of n-type gallium nitride disclosed in U.S. Pat. No. 3,922,703 include transparency, high bandgap energy, suitability for growth on sapphire and high conductivity.

Other semiconductor devices have also used gallium nitride in which the substrate is silicon. For example, in U.S. Pat. No. 4,139.858 invented by applicant, transparent, conducting n-type gallium nitride formed a heterotransition when applied to n-type silicon. Radiation in the near UV through the visible spectrum passes through the gallium nitride. However, such radiation results in carrier generation at the surface of the n-type silicon, with loss of the carriers between that surface and a pn junction inside the silicon. As a result, the radiation in the blue to UV wavelength band is not useful for voltage generation in a silicon device having a pn junction.

Other properties of gallium nitride have been recognized by Applicant and others (see "Optical Properties of GaN," RCA REVIEW. Vol. 36, March 1975, by S. Bloom, G. Harbeke and J. I. Pankove). More recent studies of gallium nitride have identified problems in synthesizing cubic gallium nitride and have indicated an expectation that it should be possible to grow cubic gallium nitride on cubic silicon carbide grown on silicon (see "Properties of Gallium Nitride," by J. I. Pankove, Mat. Res. Soc. Svmp. Proc., Vol. 97, 1987.)

Other efforts to fabricate high temperature semiconductor devices have included providing crystalline diamond on silicon carbide. Crystalline diamond has been selected for its large band gap, but problems have been experienced in fabricating a device that takes advantage of this property. For example, there have been problems in making functional heterojunctions using this material, and the conductivity of crystalline diamond has been too low.

Other attempts to fabricate high temperature devices indicate that it is difficult, if not impossible, to predict which, if any, materials having properties that appear suitable for high temperature devices will actually result in an operable high temperature device. For example, zinc oxide, zinc sulphide and silicon carbide have relatively large band gaps, which could indicate that they are suitable for these devices. However, conducting p-type and n-type zinc oxide have not been made and conducting p-type zinc sulphide has not been achieved. Also, the conductivity of silicon carbide is too low to use it as a device electrode.

Others have used gallium arsenide in various semiconductor devices. Gallium arsenide has been passivated by treatment to form a gallium nitride-rich layer on the gallium arsenide.

SUMMARY OF THE PRESENT INVENTION

Despite the knowledge of these properties of gallium nitride and silicon carbide, and the use of gallium nitride on sapphire and silicon devices, to Applicant's knowledge there are no available devices in which high operating temperature characteristics are provided by combining gallium nitride and silicon carbide, or by combining gallium nitride and gallium arsenide.

Applicant's studies indicate that a device according to the present invention having high temperature operating characteristics may be provided by depositing n-type gallium nitride on n-type silicon carbide to provide an ohmic contact or electrode to the silicon carbide.

High temperature operating characteristics are also provided in a device according to the present invention having a first pn heterojunction between a layer of p-type silicon carbide and a first layer of n-type gallium nitride. The device may be in the form of a power transistor when a second layer of n-type gallium nitride is deposited on the other surface of the silicon carbide to form a second pn heterojunction. The gallium nitride layer that is connected as an emitter is forward biased to cause electron injection into the silicon carbide layer. High temperature operating characteristics relative to silicon devices, but lower than the gallium nitride-silicon carbide devices, are provided in a device according to the present invention by using gallium arsenide instead of silicon carbide in the above power transistor.

High temperature operating characteristics may also be provided according to the present invention in an amplifying photoreceptor such as an npn phototransistor device. A transparent layer of cubic n-type gallium nitride is deposited on each side of a layer of cubic p-type silicon carbide and small electrodes are connected to the gallium nitride. Radiation passes through either or both gallium nitride layers and across the pn heterojunction to generate a photovoltage between the electrodes. However, with a bias voltage applied between the electrodes, the device operates in the photoconducting mode as a phototransistor.

High temperature operating characteristics may also be provided according to the present invention in a photovoltaic direction-sensing device. A middle layer of p-type material, such as silicon carbide or gallium arsenide, is provided on each side with a layer of n-type gallium nitride. Direction is sensed according to which side of the p-type material receives radiation.

High temperature operating characteristics may also be provided according to the present invention in a radiation-position sensor. A layer of p-type material, such as silicon carbide or gallium arsenide, is provided with at least two spaced areas. On each area a layer of gallium nitride is deposited to provide spaced pn heterojunctions that separately respond to radiation at first or second positions.

An object of the present invention is to provide a high temperature semiconductor device using a gallium nitride ohmic contact.

Another object of the present invention is to combine silicon carbide and gallium nitride to provide a device capable of high power operation.

Yet another object of the present invention is to combine gallium arsenide and gallium nitride to provide a device capable of high power operation.

A further object of the present invention is to provide an ohmic contact by depositing n-type gallium nitride on n-type cubic silicon carbide.

A still further object of the present invention resides in a power transistor having a gallium nitride electrode on one surface of a silicon carbide layer and a layer of n-type cubic gallium nitride forming a pn heterojunction on the other surface of the silicon carbide layer.

A related object of the present invention is to provide an npn phototransistor in which a transparent layer of gallium nitride is provided on each surface of a cubic p-type layer of silicon carbide or gallium arsenide to allow radiation to pass to pn heterojunctions between the gallium nitride and the silicon carbide or gallium arsenide.

An additional object of the present invention is to provide a gallium nitride layer for supplying carriers to a silicon carbide layer that controls the carriers from the gallium nitride.

Another related object of the present invention is to provide a photovoltaic direction-sensing device in which a central layer of silicon carbide or gallium arsenide is provided on each side with a layer of gallium nitride for generating photovoltages having a polarity indicative of which gallium nitride layer received incident radiation.

Still another related object of the present invention resides in a position sensor in which a layer of p-type material, such as silicon carbide or gallium arsenide, is provided with at least two spaced areas, wherein on each area a layer of gallium nitride is deposited to provide spaced pn heterojunctions that separately respond to radiation at first or second positions.

With these and other objects in view, one aspect of the present invention is illustrated by a device having high temperature operating characteristics that may be provided by depositing n-type cubic gallium nitride on n-type cubic silicon carbide to provide an ohmic contact or electrode to the silicon carbide.

High temperature operating characteristics may also be provided according to the present invention in a device having a first pn heterojunction between a layer of cubic or hexagonal p-type silicon carbide and a first layer of cubic or hexagonal n-type gallium nitride. In a power transistor, a second layer of n-type gallium nitride is deposited on the other surface of the silicon carbide to form a second pn heterojunction. The gallium nitride layer that is connected as an emitter is forward biased to cause electron injection into the silicon carbide layer. Another embodiment of the power transistor is provided with a layer of silicon instead of the second gallium nitride layer.

In a phototransistor according to the present invention and having high temperature operating characteristics, a transparent layer of cubic n-type gallium nitride is deposited on each side of either cubic p-type silicon carbide or gallium arsenide. Small electrodes are connected to the gallium nitride to minimize blockage of radiation. The radiation passes through either or both gallium nitride layers and across the pn heterojunction to generate a potential between the electrodes.

High temperature operating characteristics may also be provided according to the present invention in a photovoltaic direction-sensing device. A middle layer of p-type material, such as silicon carbide or gallium arsenide, is provided on each side with a layer of n-type gallium nitride. Direction is sensed according to which side of the p-type material receives radiation.

High temperature operating characteristics may also be provided according to the present invention in a radiation-position sensor. A layer of p-type material, such as silicon carbide or gallium arsenide, is provided with two or four spaced areas. On each area a layer of gallium nitride is deposited to provide spaced pn heterojunctions that separately respond to radiation at first or second positions. With the four areas and pn heterojunctions arranged orthogonally, the sensor responds to radiation position along x and y axes.

BRIEF DESCRIPTION OF THE DRAWINGS

Other objects, features and advantages of the present invention will be apparent from an examination of the following detailed descriptions, which include the attached drawings in which:

FIG. 1 shows a first semiconductor device according to the present invention where the device is in the form of a power rectifier and a layer of n-type gallium nitride is a first connection to a layer of silicon carbide to form an ohmic contact;

FIG. 2A shows a first embodiment of a power transistor of the present invention, in which the collector is a pn homojunction in a silicon carbide layer and the emitter is an n-type gallium nitride layer forming a heterojunction to the p-type silicon carbide layer;

FIG. 2B shows a second embodiment of the power transistor in which a second n-type gallium nitride layer forms a heterojunction to the silicon carbide layer;

FIG. 3A shows the energy bands of the power transistor under equilibrium conditions;

FIG. 3B shows the energy bands of the power transistor with the emitter forward biased and the collector reverse biased;

DETAILED DESCRIPTION OF THE INVENTION

Figure 4:
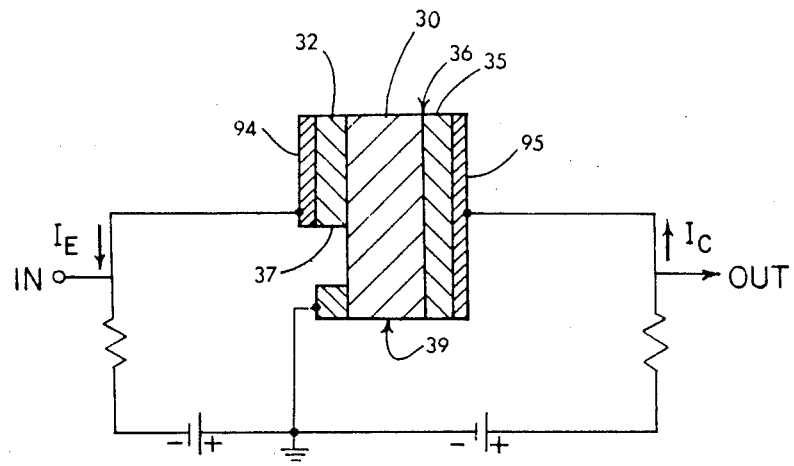
FIG. 4 shows the second embodiment of the power transistor connected in a circuit.

Power Rectifier 10 with Gallium Nitride Ohmic Contact 13

Referring to FIG. 1, a first device 10 according to the present invention is shown including a layer 11 of n-type silicon carbide provided with a surface 12. A layer 13 of n-type gallium nitride is provided on the surface 12 of the silicon carbide layer 11. A heterotransition 14 is formed between these two layers 11 and 13. The gallium nitride layer 13 is undoped, has a high conductivity and forms an ohmic contact to the n-type silicon carbide layer 11. The layers 11 and 13 are very refractory, with gallium nitride decomposing at about 1000° C. and silicon carbide decomposing at still higher temperatures, which provides high temperature operating characteristics for the first device 10. In this sense, the first device 10 is capable of operating at temperatures up to 700° C., whereas silicon devices have substantially lower operating temperatures, up to 125° C., for example.

The layer 13 of gallium nitride is preferably provided in cubic form having a lattice constant of about 4.51Å and the layer 11 of silicon carbide is provided in cubic form having a lattice constant of about 4.359Å. Alternatively, the layers 11 and 13 may be provided in hexagonal form having a basal plane lattice constant of about 3.08Å for the silicon carbide layer 11 and a basal plane lattice constant of about 3.18Å for the gallium nitride layer 13.

The first device 10 is shown in FIG. 1 in the form of a Q poWer rectifier that also includes a layer 15 of p-type silicon carbide adjacent the layer 11 of n-type silicon carbide, and a pn junction 16 between the respective n and p layers 11 and 15 of silicon carbide.

Power Transistor 17

Referring to FIGS. 2A and 2B, a second device 17 according to the present invention is shown in the form of a power transistor. FIG. 2A shows a first layer 18 of n-type gallium nitride. The second device 17 is provided with a p-type semiconductor layer 19 having a first surface 20 with which the n-type gallium nitride layer 18 forms a heterojunction 21. The p-type layer 19 is silicon carbide having a second surface 22. A second n-type layer 23 of silicon carbide is provided on the second surface 22. In one embodiment, the gallium nitride layer 18 and the silicon carbide layers 19 and 23 are in cubic form. Alternatively, these layers 18, 19 and 23 may be in hexagonal form. In these embodiments, the gallium nitride layer 18 and the silicon carbide layers 19 and 23 have the lattice constants described above with respect to FIG. 1. In the hexagonal embodiment, the interfaces are basal planes.

In one embodiment of the power transistor 17 shown in FIG. 2A, the layer 19 is a p-type silicon carbide region and the n-type layer 23 is an n-type silicon carbide region, with a pn homojunction 24 between the silicon carbide layers 19 and 23. The first layer 18 of n-type gallium nitride is on the first surface 20 and the silicon carbide layer 23 has a second surface 25 adjacent a second n-type layer 26 made of silicon. In this embodiment, the first n-type layer 18 is the emitter 27, and the second layer 23 is the collector 28, and the p-type region 19 is the base 29. The emitter 27 is forward biased relative to the silicon carbide layer 19. Electrode contacts a, b and c may be a refractory metal such as tungsten, molybdenum or tantalum. The energy gap of the cubic gallium nitride emitter 27 is 3.4 eV and the energy gap of the cubic silicon carbide base 29 is 2.2 eV.

In a second embodiment of the power transistor 17 shoWn in FIG. 2B, a p-type silicon carbide layer 30 has a surface 31 adjacent an n-type gallium nitride layer 32 With which it forms a first heterojunction 33. On an opposite surface 34 of the silicon carbide layer 30, a second n-type layer 35 made of gallium nitride is provided. The second layer 35 of gallium nitride forms a second heterojunction 36 with the p-type silicon carbide layer 30. As in the first embodiment, the gallium nitride layer 32 is the emitter 37, the second n-type layer 35 is the collector 38 and the silicon carbide layer 30 is the base 39. Forward biasing of the emitter 37 relative to the base 39 results in electron injection into the base 39. Electrode contacts a, b and c may be a refractory metal such as tungsten, molybdenum or tantalum.

Phototransistor 40

Figures 5A, 5B:
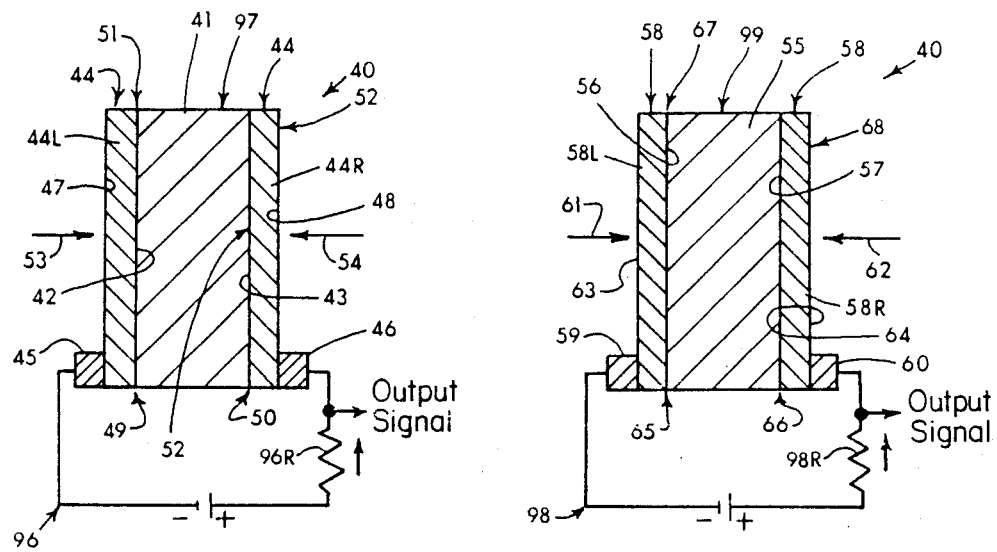
FIG. 5A shows a photoreceptor having a pn heterojunction between layers of gallium nitride and silicon carbide.
FIG. 5B shows a photoreceptor having a pn heterojunction between layers of gallium nitride and gallium arsenide.

A third device 40 according to the present invention is shown in FIG. 5A in the form of an amplifying photoreceptor, such as a phototransistor. The phototransistor 40 is similar to the second embodiment of the power transistor 17 in that it has a p-type silicon carbide layer 41 having first and second surfaces 42 and 43 respectively. A layer 44 of u-type gallium nitride is provided on each of the surfaces 42 and 43 and metal electrodes 45 and 46 are connected to each gallium nitride layer 44. The left layer 44 is designated layer 44L and the right layer 44 is designated layer 44R. The n-type gallium nitride layers 44 are transparent to radiation (see arrows 53 and 54) in the UV to visible spectrum and thus allow radiation incident on outer surfaces 47 and 48 on both sides of the third device 40 to pass through the layers 44 to pn heterojunctions 49 and 50. The pn heterojunction 49 is the emitter junction 51 and the gallium nitride layer 44R is the collector 52. The radiation 53 and 54 absorbed in the layer 41 generates photocarriers in the form of electrons and holes. If a bias is applied across the metal electrodes 45 and 46 that are connected to the gallium nitride layers 44 of the third device 40, then the photogenerated holes accumulate in the p-type layer 41 forward biasing the emitter junction 51, allowing a larger electron current to flow from the emitter 51 to the collector 52.

A second embodiment of an amplifying photoreceptor 40 is shown in FIG. 5B as a phototransistor that differs from the first embodiment of the third device 40 in that it has a gallium arsenide layer 55 having first and second surfaces 56 and 57 respectively. A layer 58 of u-type gallium nitride is provided on each of the surfaces 56 and 57, with the left layer 58 designated 58L and the right layer 58 designated 58R. Metal electrodes 59 and 60 are connected to each gallium nitride layer 58. The n-type gallium nitride layers 58 are transparent to radiation (see arrows 61 and 62) in the UV to visible spectrum and thus allow the radiation 61 and 62 incident on outer surfaces 63 and 64 on both sides of the third device 40 to pass through the layers 58L and 58R to pn heterojunctions 65 and 66 respectively. The pn heterojunction 65 is the emitter junction 67 and the gallium nitride layer 58R is the collector 68. The radiation 61 and 62 absorbed in the layer 55 generates photo-carriers as holes and electrons in the layer 55. If a bias is applied across the metal electrodes 59 and 60 that are connected to the gallium nitride layers 58L and 58R, the photogenerated holes accumulate in the p-type layer 55 and electron current flows from the emitter 67 to the collector 68 as described with respect to FIG. 5A.

Photovoltaic Direction Sensor 70

Figure 6C:
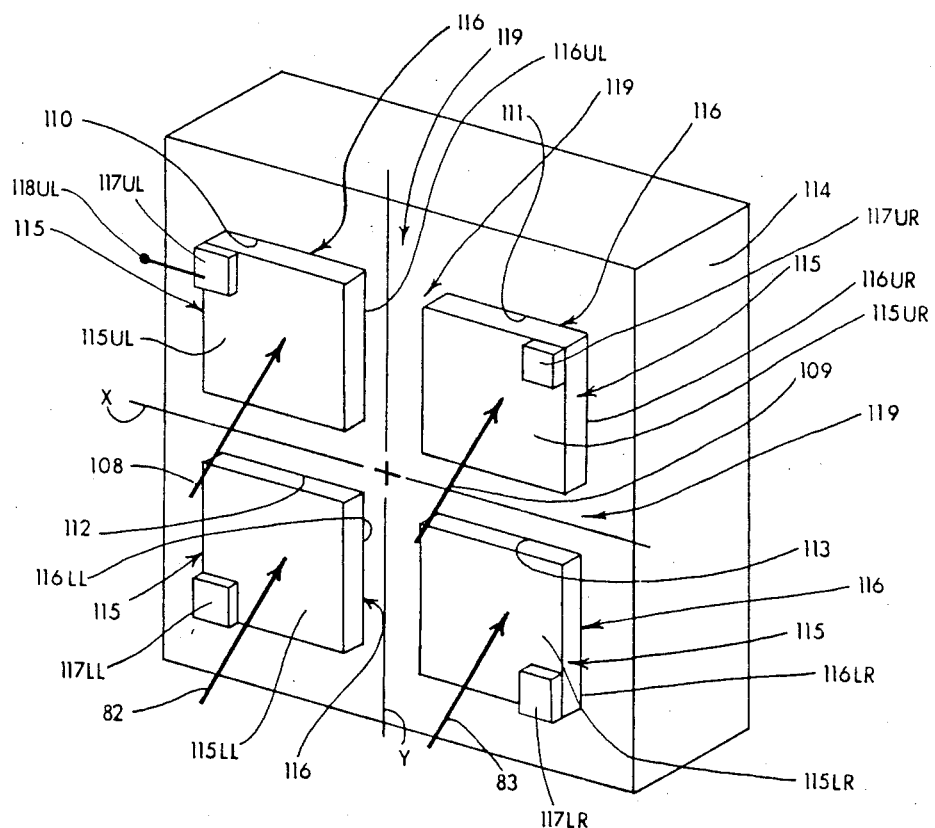
FIG. 6C shows a photovoltaic photoreceptor in the form of a position sensor having four pn heterojunctions between adjacent layers of gallium nitride and an underlying layer of silicon carbide or gallium arsenide.
Figure 6A:
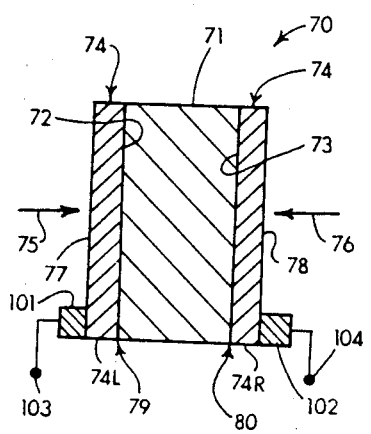
FIG. 6A shows a photovoltaic photoreceptor in the form of a direction sensor having a layer of gallium nitride on each side of a central layer of silicon carbide or gallium arsenide.

A fourth device 70 is shown in FIG. 6A in the form of a photovoltaic direction-sensing device or sensor in which a central layer 71 of silicon carbide or gallium arsenide is provided on each surface 72 and 73 with a layer 74 of gallium nitride for generating photovoltages having a polarity indicative of which gallium nitride layer (74L designating the left layer and 74R designating the right layer) receives incident radiation (see arrows 75 and 76). In particular, with radiation 75 (such as visible light) directed onto a left side 77 of the sensor 70, a left pn heterojunction 79 is effective to cause holes to move into the central layer 71 and electrons to move into the left gallium nitride layer 74L, such that the polarity across the sensor 70 − +. This polarity indicates that the radiation 75 was incident from the left. Radiation 76 incident on a right side 78 of the sensor 70 causes an opposite, + − polarity across the sensor 70.

Radiation Position Sensor 81

Figure 6B:
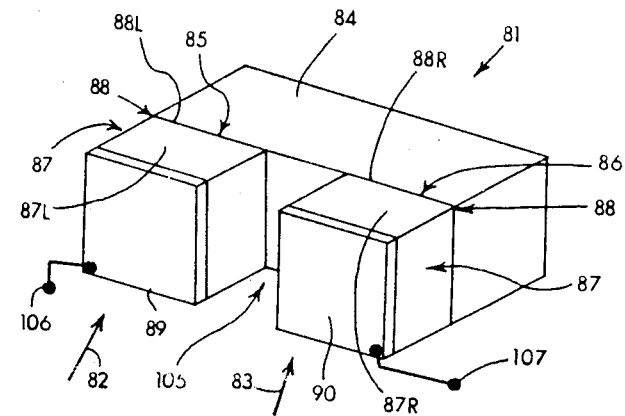
FIG. 6B shows a photovoltaic photoreceptor in the form of a position sensor having two pn heterojunctions between adjacent layers of gallium nitride and an underlying layer of silicon carbide or gallium arsenide.

A fifth device 81 according to the principles of the present invention is shown in FIG. 6B as a sensor for indicating the position of radiation (shown as an arrow 82 in a left position and an arrow 83 in a right position). In a first embodiment, the sensor 81 includes a layer 84 of p-type material, such as silicon carbide or gallium arsenide, that is provided with two spaced areas 85 and 86. On each area 85 and 86 a layer 87 of gallium nitride is deposited to provide spaced pn heterojunctions 88 that separately respond to radiation at the first or second positions 82 and 83 respectively. Layer 87L is on the left and layer 87R is on the right. For example, the radiation 82 incident on the left gallium nitride layer 87L causes the left pn heterojunction 88L to provide electrons in the gallium nitride layer 87L so that a negative potential appears at a left electrode 89 to indicate that the radiation was positioned at the left position 82. In a similar manner, the radiation positioned at the right position 83 results in a negative potential at a right electrode 90 to indicate that the radiation is at the right position 83.

Detailed Description: Device 10 with Ohmic Contact 13

Referring again to FIG. 1, the power rectifier 10 is shown in detail as the first device. The layer 13 of n-type gallium nitride is provided with an electrode 91 and an electrode 92 is provided on a surface 93 of the silicon carbide layer 15.

To fabricate the first device 10, cubic n-type silicon carbide is grown on a silicon substrate (not shown) using, for example, the process disclosed by S. Nishino, J. A. Powell and H. A. Will in their article in *Applied Physics Letters*, Vol. 42, p. 460 (1983) (the "Nishino article") to form the layer 11. Alternatively, the process disclosed in the Paper by M. J. Paisley, Z. Sitar, C. H. Carter, Jr. and R. F. Davis, Proc. SPIE 877, Carl A. Kukkonen, ed., August, 1988, may be used. During this process, the silicon carbide is doped with boron or aluminum to provide a single crystal of the desired p-type conductivity that forms the silicon carbide layer 15, which preferably has a slightly off-axis orientation. This off-axis orientation may be, for example, growth on the (100) surface of silicon tilted one degree off-axis toward the (110) direction.

Alternatively, as described by M. J. Paisley, Z. Sitar, J. B. Posthill and R. F. Davis in their paper presented at the 35th National Symposium of the American Vacuum Society, Oct. 2–6, 1988, Session EM-TLA3, Abstract No. 695 (the "Paisley paper"), the silicon carbide layers 11 and 15 can be epitaxially grown on (100) silicon substrates by chemical vapor deposition of silicon and carbon from pyrolysis of highest purity $SiH_4$ and $C_2H_4$ entrained in $H_2$.

The n-type cubic gallium nitride layer 13 may be grown on the cubic n-type silicon carbide layer 11 using, for example, a commercial Perkin Elmer 430 MBE system (not shown) with modifications as described in the Paisley paper.

Next, the metal electrode 91 is deposited on the gallium nitride layer 13 and following removal (as by etching) of the silicon layer, the metal electrode 92 is deposited on the silicon carbide layer 15 in the desired pattern by evaporation through a mask or by evaporation or sputtering followed by photolithography to etch away selected portions of the metal.

The hexagonal gallium nitride layer 13 and the silicon carbide layers 11 and 15 used in the other embodiment of the power rectifier 10 are grown directly on the basal plane of commercially available hexagonal silicon carbide using chemical vapor deposition, molecular beam epitaxy, metal organic chemical vapor deposition, electron cyclotron resonance plasma assisted chemical vapor deposition or ion cluster beam deposition techniques.

The use of the gallium nitride layer 13 in either cubic or hexagonal form provides an ohmic connection to the silicon carbide layer 11, which avoids problems of non-linearity of the current-voltage characteristics of the connection as when materials such as tungsten are used as contacts. Additionally, the high conductivity of the gallium nitride layer 13 provides a copious source of electrons needed for a low resistance connection.

Detailed Description of Power Transistor 17

Referring again to FIG. 2A, the first embodiment of the power transistor 17 is shown. The process disclosed above in the Nishino article may be used to provide the surface 22 with the layer 19 of p-type silicon carbide, except that aluminum or boron is used as the dopant to provide the desired p-type, cubic silicon carbide. Alternatively, the acceptor (e g., boron) may be introduced by ion implantation into the surface 22 of the layer 23 of the n-type silicon carbide to form the pn homojunction 24 in the silicon carbide. In that event, thermal annealing is needed to reduce the damage caused by ion implantation. The heterojunction 21 is formed between the layer 18 of n-type cubic gallium nitride and the layer 19 of p-type cubic silicon carbide by the same process in which the cubic n-type gallium nitride layer 13 is grown on the n-type silicon carbide layer 11 as described above with respect to FIG. 1. Alternatively, the layer 18 of gallium nitride can be deposited on the p-type silicon carbide layer 19 by another method, such as the chemical vapor deposition method disclosed by Maruska and Tietjen in Appl. Phys. Letters 15 327 (1969).

The energy bands of the first embodiment of the power transistor 17 are shown in FIGS. 3A and 3B as a function of position along the transistor 17 from the n-type emitter layer 18 to the p-type base layer 19 to the n-type collector layer 23. In FIG. 3A, the energy bands are shown under equilibrium conditions without external bias applied to the emitter 27, the base 29 and the collector 28. $E_c$, $E_v$ and $E_F$ refer to the conduction band edge, the valence band edge and the Fermi level, respectively. Referring to FIG. 3B, when the emitter 27 is forward biased relative to the base 29 and the collector-base pn homojunction 24 is reverse-biased, a large current can flow across the pn homojunction 24. Because of the large difference in the energy gaps, the forward biasing causes electron injection into the conduction band of the cubic silicon carbide layer 19 while the step in the valence band at the interface between the emitter 27 and the base 29 forms a hole-blocking barrier that prevents the escape of holes from the base 29 into the emitter 27. The relatively large energy gaps of both the emitter 27 and the base 29 enable the device 17 to operate at elevated temperatures referred to with respect to the first device 10 and dissipate considerable power.

The second embodiment of the power transistor 17 as shown in FIG. 2B is shown connected in a circuit in FIG. 4. The power transistor 17 has the two layers 32 and 35 formed from gallium nitride so that a gallium nitride layer forms both the emitter 37 and the collector 38. The transistor 17 is fabricated by forming the layers 32 and 35 on the layer 30 as described above with respect to FIG. 2B. To remove the silicon layer 26 of FIG. 2A, the silicon is etched from the second surface 34 (FIG. 2B) using a well known etchant, such as a mixture of nitric and hydrofluoric acids. Using the processes described above, the second layer 35 of n-type cubic gallium nitride is then grown on the second surface 34 of the p-type silicon carbide layer 30 and metal electrodes 94 and 95 are deposited at the locations shown in FIGS. 2B and 4.

The power transistor 17 is shown in FIG. 4 connected in a standard common base configuration. The forward-biased emitter-base heterojunction 36 shown in FIGS. 2B and 4 causes electron injection into the conduction band of the layer 30 of cubic p-type silicon carbide and the hole blocking barrier prevents the escape of holes from the base 39 into the emitter 37. Because the energy gap of the cubic gallium nitride layer 32 is so much larger (by 1.2 eV) than that of the cubic silicon carbide layer 30, the electron injection efficiency can attain the high value of unity.

Detailed Description of Phototransistor 40

Referring now to FIG. 5A, the amplifying photoreceptor 40 is shown in the form of the phototransistor. The cubic p-type silicon carbide layer 41 is deposited on the silicon layer 26 (see FIG. 2A) as described with respect to FIG. 2A, and the n-type gallium nitride layers 44L and 44R are grown as described above with respect to FIGS. 2A, 2B and 4. However, as shown in FIG. 5A, the first (or left) gallium nitride layer 44L is grown on the entire first (or left) surface 42 of the silicon carbide layer 41 to present a larger area heterojunction 49 to receive the radiation 53. Similarly, the heterojunction 50 at the second surface 43 extends over the whole area of the silicon carbide layer 41 to receive the radiation 54.

The phototransistor 40 also differs from the power transistor 17 in that the metal electrodes 45 and 46 are of minimal size so that they block a minimum of the incident radiation 53 and 54. The electrodes 45 and 46 are shown biased in a standard manner by a circuit 96. The potential across the base 97 and the emitter 51 is modulated optically in response to the radiation 53 and 54 in the UV to near infrared spectrum that generates a space charge of holes in the silicon carbide layer 41. In this manner, photocurrent in the circuit 96 is dependent on the radiation 53 and 54 input to the pn heterojunctions 49 and 50. The output signal is derived as a voltage across a resistor 96R in which the photocurrent flows.

Referring now to FIG. 5B, the second embodiment of the amplifying photoreceptor 40 is shown in the form of the second phototransistor that uses a crystal of p-type gallium arsenide as the radiation sensing layer instead of the silicon carbide layer 41 of FIG. 5A. The n-type gallium nitride layers 58L and 58R are grown as described above. As shown in FIG. 5B, the first gallium nitride layer 58L is grown on the entire first surface 56 of the gallium arsenide layer 55 to present the large area heterojunction 65 to radiation (illustrated by the arrow 61). Similarly, the heterojunction 66 at the second surface 57 of the gallium arsenide layer 55 extends over the full area of the gallium arsenide layer 55 to receive the radiation (illustrated by the arrow 62). The first and second embodiments of the phototransistors 40 are similar in that the electrodes 59 and 60 are of minimal size so that they block a minimum of the radiation 61 and 62 that is incident on the device 40. The electrodes 59 and 60 are shown biased in a standard manner by a circuit 98. The potential from the base 99 to the emitter 67 is modulated optically in response to the radiation in the UV to near infrared spectrum. In this manner, photocurrent in the circuit 98 is dependent on the radiation 61 or 62 input to the respective pn heterojunctions 65 or 66. The output signal is derived as a voltage across a resistor 98R in which the photocurrent flows. The advantage of using gallium arsenide instead of silicon carbide is to extend the spectral response of the device 40 and to take advantage of the higher sensitivity due to direct optical transitions in the direct gap gallium arsenide. However, the advantage of silicon carbide over the arsenide is that the silicon carbide detector 40 is sensitive only in the short wavelength range of the spectrum.

Detailed Description of Sensor 70

Referring again to FIG. 6A, the sensor 70 may be fabricated in the same manner as described with respect to FIG. 5A (when the layer 71 is silicon carbide) or with respect to FIG. 5B (when the layer 71 is gallium arsenide). Electrodes 101 and 102 are provided in the manner of the electrodes 45 and 46 (FIG. 5A) for extracting the potential generated. Instead of the circuit 96 (FIG. 5A), the potential generated across the electrodes 101 and 102 is sensed using contacts 103 and 104. The radiation 75 causes a negative potential and a positive potential at the respective contacts 103 and 104, whereas the radiation 76 causes a positive potential and a negative potential at the respective contacts 103 and 104.

Detailed Description of Sensor 81

The p-type layer 84 of the first embodiment of the sensor 81 is fabricated in the manner described above with respect to FIG. 5A (for silicon carbide) or with respect to FIG. 5B (for gallium arsenide). The layers 87L and 87R of gallium nitride are deposited as described with respect to FIG. 5A, with the configuration of the layers 87L and 87R being as shown in FIG. 6B with a space 105 therebetween and the respective layers 87L and 87R on the areas 85 and 86. Contacts 106 and 107 are used to sense the potential resulting from the radiation at the respective positions 82 or 83 to indicate the position of that radiation.

A second embodiment of sensor 81 is shown in FIG. 6C. This embodiment responds to the radiation in the positions 82 and 83 that are spaced along one orthogonal axis, an x axis, and to radiation in positions 108 and 109 that are spaced with respect to positions 82 and 83 along a y axis orthogonal to the x axis. This embodiment has four spaced areas 110, 111, 112 and 113 on a layer 114 of p-type material that is similar to the layer 84 of FIG. 6B. On each area 110-113 a layer 115 of gallium nitride is deposited to provide four pn heterojunctions 116 that separately respond to the radiation in the respective positions 82, 83, 108 and 109. The layers 115 are designated 115UL to represent the upper left layer of gallium nitride, 115UR to represent the upper right layer of gallium nitride, 115LL to represent the lower left layer of gallium nitride and 115LR to represent the lower right layer of gallium nitride. The pn heterojunctions 116 are similarly designated 116UL, 116UR, 116LL and 116LR, and are respectively provided with electrodes 117UL, 117UR, 117LL and 117LR that are respectively provided with contacts, such as a contact 118UL. Spaces 119 are provided between the layers 115UL, 115UR, 115LL and 115LR.

The second embodiment of the position sensor 81 senses the position of the radiation along the x and y axes as when the radiation at the lower left position 82 moves up along the y axis to upper left position 108, or moves right along the x axis to the lower right position 83, for example. These positions are indicated by potentials at the respective electrodes 117LL, 117UL and 117LR.

The sensors 81 are responsive to a broad range of radiation, from ultraviolet, where there are higher photon energies, to the visible spectrum. The response of the sensors 81 enables the sensors 81 to be used in sensing laser radiation having relatively short wavelengths, for example. As in the sensor 70, the radiation in the various positions 82, 83, 108 and 109 passes through the transparent layers 115 of gallium nitride and passes into the layer 114 of silicon carbide and generates photocarriers as holes and electrons. The pn heterojunction 116 at the position of the radiation is effective to cause the holes to move into the layer 114 of silicon carbide or gallium arsenide and the electrons to move into the respective gallium nitride layer 115 to form a potential at the respective electrode 117.

While the preferred embodiments have been described in order to illustrate the fundamental relationships of the present invention, it should be understood that numerous variations and modifications may be made to these embodiments without departing from the teachings and concepts of the present invention. Accordingly, it should be clearly understood that the form of the present invention described above and shown in the accompanying drawings is illustrative only and is not intended to limit the scope of the invention to less than that described in the following claims.

What is claimed is:

1. A semiconductor device, comprising:
an n-type silicon carbide semiconductor layer having a surface, said silicon carbide layer being cubic silicon carbide having a lattice constant of about 4.359Å; and
a transparent, conducting layer deposited on said surface, said transparent layer being formed from n-type gallium nitride to provide an ohmic contact on said silicon carbide layer, said gallium nitride layer being cubic gallium nitride having a lattice constant of about 4.51Å.

2. A power rectifier semiconductor device according to claim 1, further comprising:
said n-type silicon carbide layer having a second surface;
a cubic p-type silicon carbide layer on said second surface to form a pn junction with said n-type silicon carbide layer; and
an electrode provided on each of said cubic gallium nitride and cubic p-type silicon carbide layers.

3. A semiconductor power transistor comprising:
a p-type silicon carbide layer having a first surface;
a first n-type gallium nitride layer deposited on said first surface;
said p-type silicon carbide layer having an energy gap that is substantially less than that of said first gallium nitride layer and having a second surface opposite said first surface;
a second n-type gallium nitride layer in contact with said second surface, said second n-type gallium nitride layer forming a pn heterojunction with said second surface; and
said p-type silicon carbide layer being the base of said power transistor and said n-type gallium nitride layers being the emitter and the collector of said power transistor.

4. A power transistor according to claim 3 wherein:
said energy gaps of said p-type silicon carbide layer and said gallium nitride electrode differ by at least 1.2 eV so that forward biasing said emitter causes electron injection into said p-type layer.

5. A power transistor according to claim 4, wherein:
upon forward biasing of said emitter with respect to said p-type silicon carbide layer, said gallium nitride emitter and said p-type silicon carbide layer have a barrier therebetween for preventing the escape of holes from said base to said gallium nitride emitter.

6. A power transistor according to claim 5, wherein:
said p-type silicon carbide layer is cubic silicon carbide; and
a pn homojunction is in said cubic silicon carbide layer.

7. A power transistor according to claim 5, wherein:
said p-type silicon carbide layer is hexagonal silicon carbide.

8. A power transistor according to claim 7, wherein:
a pn homojunction is in said hexagonal silicon carbide.

9. An amplifying photoreceptor comprising:
a semiconductor device having an emitter, a base and a collector, said base having at least one surface adapted to receive radiation and being formed from a layer of cubic p-type silicon carbide;
said emitter being formed from a layer of cubic n-type gallium nitride provided on said surface.

10. An amplifying photoreceptor according to claim 9, wherein:
said cubic n-type gallium nitride layer forms a pn heterojunction with said cubic p-type silicon carbide base and is transparent to radiation in the UV to near infrared spectrum to provide a conducting transparent window on said surface.

11. A amplifying photoreceptor according to claim 9, further comprising:
said base having a second surface for receiving radiation; and
said collector is formed from a layer of cubic n-type gallium nitride on said second surface.

12. An amplifying photoreceptor comprising:
a semiconductor device having an emitter, a base and a collector, said base having at least one surface adapted to receive radiation and being formed from a layer of gallium arsenide;
said emitter being formed from a layer of n-type gallium nitride provided on said surface.

13. An amplifying photoreceptor according to claim 12, wherein:
said gallium nitride layer forms a pn heterojunction with said base and is transparent to radiation in the UV to near infrared spectrum to provide a conducting transparent window on said surface.

14. A semiconductor photovoltaic direction-sensing device, comprising:
a first layer made of p-type gallium arsenide having opposite surfaces for receiving radiation from first and second different directions;
a second layer made of n-type gallium nitride formed on one of said opposite surfaces;
a first pn heterojunction between said first layer and said second layer;
said second layer being transparent for allowing the radiation from said first direction to be received on said first pn heterojunction to generate a photovoltage having a first polarity indicating response to the radiation from said first direction;
a third layer made of n-type gallium nitride formed on the other of said opposite surfaces;
a second pn heterojunction between said first layer and said third layer;
said third layer being transparent for allowing the radiation from said second direction to be received on said second pn heterojunction to generate a photovoltage having a second polarity indicating response to the radiation from said second direction; and
metal electrodes contacting each said second and third respective layers for extracting said photovoltages externally of said device.

15. A semiconductor photovoltaic direction-sensing device having high temperature operating characteristics, comprising:
a first layer of p-type cubic silicon carbide having opposite surfaces for receiving radiation from first and second different directions;
a second layer of n-type cubic gallium nitride formed on one of said opposite surfaces;
a first pn heterojunction between said first layer and said second layer;
said second layer being transparent for allowing the radiation from said first direction to be received on said first pn heterojunction to generate a photovoltage having a first polarity indicating response to the radiation from said first direction;
a third layer made of n-type cubic gallium nitride formed on the other of said opposite surfaces;
a second pn heterojunction between said first layer and said third layer;
said third layer being transparent for allowing the radiation from said second direction to be received on said second pn heterojunction to generate a photovoltage having a second polarity indicating response to the radiation from said second direction; and
metal electrodes contacting each said second and third respective layers for applying said photovoltages externally of said device to indicate the direction from which the radiation is incident on said device.

16. A semiconductor photovoltaic position sensing comprising:
a first layer made of p-type silicon carbide and having a first surface, said first surface having a first area and a second area, said first area being adapted to receive radiation from a first position, said first area being spaced from said second area of said first surface, said second area being adapted to receive radiation from a second position;
a second layer made of n-type gallium nitride and being on said first area for forming a first pn heterojunction with said first silicon carbide layer, said second layer being transparent for allowing the radiation from said first position to be received on said first pn heterojunction to generate a first photovoltage for indicating the radiation from said first position; and
a third layer made of n-type gallium nitride and being on said second area for forming a second pn heterojunction with said first silicon carbide layer, said third layer being transparent for allowing the radiation from said second position to be received on said second pn heterojunction to generate a second photovoltage for indicating the radiation from said second position.

17. A semiconductor photovoltaic position sensing device according to claim 16, further comprising:
said first layer also having third and fourth areas spaced from said first and second areas in a direction orthogonal to a direction defined by said first and second areas, said third area being spaced from said first, second and fourth areas of said first surface, said third area being adapted to receive radiation from a third position; said fourth area being spaced from said first, second and third areas, said fourth area being adapted to receive radiation form a fourth position;
a fourth layer made of n-type gallium nitride and being on said third area for forming a third pn heterojunction with said first silicon carbide layer, said fourth layer being transparent for allowing the radiation from said third position to be received on said third pn heterojunction to generate a third photovoltage for indicting the radiation from said third position; and
a fifth layer made of n-type gallium nitride and being on said fourth area for forming a fourth pn heterojunction with said first silicon carbide layer, said fifth layer being transparent for allowing the radiation from said fourth position to be received on said fourth pn heterojunction to generate a fourth photovoltage for indicating the radiation from said fourth position.

18. A semiconductor photovoltaic position sensing device, comprising:
a first layer made of p-type gallium arsenide and having a first surface, said first surface having a first area for receiving radiation from a first position, said first area being spaced from a second area of said first surface for receiving radiation from a second position;

a second layer made of n-type gallium nitride and being on said first area for forming a first pn heterojunction with said first gallium arsenide layer, said second layer being transparent for allowing the radiation from said first position to be received on said first pn heterojunction to generate a first photovoltage for indicating the radiation from said first position; and a third layer made of n-type gallium nitride and being on said second area for forming a second pn heterojunction with said first gallium arsenide layer, said third layer being transparent for allowing the radiation from said second position to be received on said second pn heterojunction to generate a second photovoltage for indicating the radiation from said second position.

19. A semiconductor photovoltaic position sensing device according to claim 18, further comprising:

said first layer also having third and fourth areas spaced from said first and second areas in a direction orthogonal to a direction defined by said first and second areas, said third area being spaced from said first, second and fourth areas of said first surface, said third area being adapted to receive radiation from a third position, said fourth area being spaced from said first, second and third areas, said fourth area being adapted to receive radiation from a fourth position;

a fourth layer made of n-type gallium nitride and being on said third area for forming a third pn heterojunction with said first silicon carbide layer, said third layer being transparent for allowing the radiation from said third position to be received on said third pn heterojunction to generate a third photovoltage for indicating the radiation form said third position; and a fifth layer made of n-type gallium nitride and being on said fourth area for forming a fourth pn heterojunction with said first silicon carbide layer, said fifth layer being transparent for allowing he radiation from said fourth position to be received on said fourth pn heterojunction to generate a fourth photovoltage for indicating the radiation form said fourth position.

* * * * *